United States Patent [19]

Kalb, Jr.

[11] Patent Number: 5,757,055

[45] Date of Patent: May 26, 1998

[54] TRIPLE DRAIN MAGNETO FIELD EFFECT TRANSISTOR WITH HIGH CONDUCTIVITY CENTRAL DRAIN

[75] Inventor: Jeffrey C. Kalb, Jr., Phoenix, Ariz.

[73] Assignee: Intel Corporation, Santa Clara, Calif.

[21] Appl. No.: 718,058

[22] Filed: Sep. 17, 1996

[51] Int. Cl.$^6$ .................................................. H01L 29/82
[52] U.S. Cl. ........................ 257/421; 257/422; 257/426; 257/427
[58] Field of Search .................... 257/421, 422, 257/424, 426, 427

[56] References Cited

U.S. PATENT DOCUMENTS

| 3,829,883 | 8/1974 | Bate | 257/421 |
|---|---|---|---|
| 4,100,563 | 7/1978 | Clark | 257/421 |
| 4,683,429 | 7/1987 | Popovic | 324/225 |
| 4,700,211 | 10/1987 | Popovic et al. | 257/421 |
| 4,710,704 | 12/1987 | Ando | 324/73 R |
| 4,893,073 | 1/1990 | McDonald et al. | 324/117 H |
| 4,926,116 | 5/1990 | Talisa | 324/117 H |
| 5,153,557 | 10/1992 | Partin et al. | 338/32 R |
| 5,247,278 | 9/1993 | Pant et al. | 338/32 R |
| 5,392,293 | 2/1995 | Hsue | 324/158.1 |

OTHER PUBLICATIONS

"An Evaluation of IDDQ Versus Conventional Testing for CMOS Sea-of-Gate IC's", K. Sawada and S. Kayano, *ASIC Design Engineering Center, Mitsubishi Electric Corporation*, 1992, IEEE.

"IDDQ Testing Makes a Comeback", Dan Ramanchik, *Test & Measurement World*, Oct., 1993, p. 58.

"Built-In-Current Testing -Feasibility Study", Wojciech Maly and Phil Nigh, *Department of Electrical and Computer Engineering, Carnegie Mellon University*, 1988, IEEE.

"Master Series IDDQ Product Description-R0.4-Preliminary Jan. 94", *Master Series IDDQ Monitor*, Copyright 1991/1992, LTX Corporation.

Built-in Current Sensor for IDDQ Test in CMOS, Ching-Wen Hsue and Chih-Jen Lin, *AT&T Bell Laboratories*, 1993, IEEE.

"Circuit Design for Built-In Current Testing", Yukija Miura and Kozo Kinoshita, *Department of Applied Physics, Osaka University*, 1992, IEEE.

"A General Purpose IDDQ Measurement Circuit", Kenneth M. Wallquist, Alan W. Righter and Charles F. Hawkins, *Electrical & Computer Engineering Department, The University of New Mexico*, 1993, International Test Conference.

"IDDQ and Reliability", Robert C. Aitken, *Design Technology Center, Palo Alto, California*, Apr. 26, 1994, Hewlett-Packard.

"IDDQ Background Paper on Sematech/Sandia/UNM Project", Alan Righter & Chuck Hawkins, Apr. 4, 1994, *The University of New Mexico Electrical and Computer Engineering Dept.*

*Primary Examiner*—Minh-Loan Tran
*Attorney, Agent, or Firm*—Blakely, Sokoloff, Taylor & Zafman

[57] ABSTRACT

A triple drain magnetic field effect transistor (MagFET) for measuring magnetic field. The disclosed MagFET has a gate, a source, a center drain and two lateral drains and generates an increased Hall voltage between the two lateral drains. The MagFET provides a high conductivity channel disposed between the center drain and the source to allow a high sense current to flow. The relationship between the sense current and the background carrier concentration of the lateral drains of the transistor are effectively reduced or decoupled in order to provide the increased Hall voltage between the lateral drains in response to a magnetic field. The sense current is decoupled from the background carrier concentration of the lateral drains of the transistor by suppressing the threshold adjust ion implantation step of the high conductivity channel such that when measuring magnetic field, the carrier concentration of the high conductivity channel is greater than the carrier concentration of the regions of the two lateral drains of the MagFET.

8 Claims, 3 Drawing Sheets

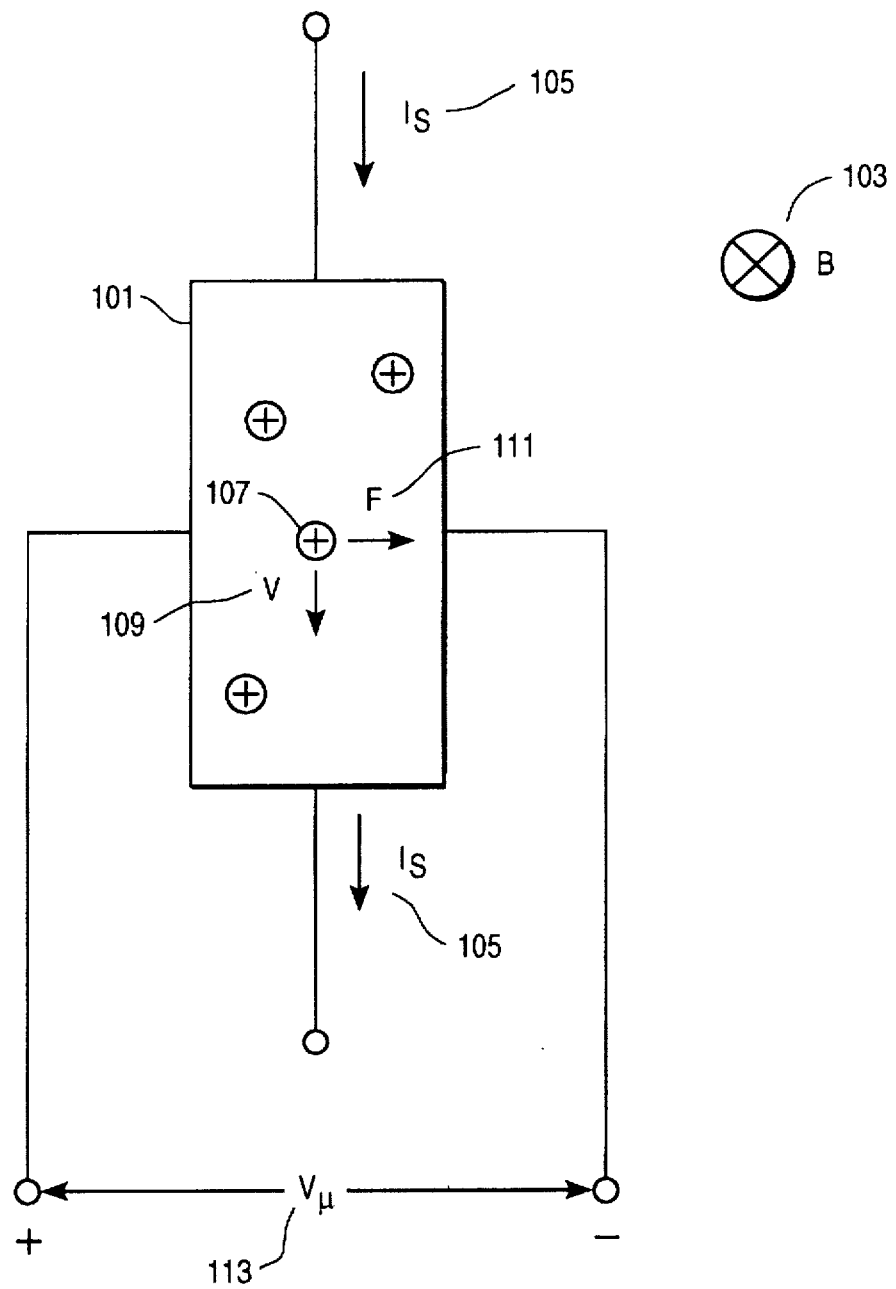
FIG_1 (PRIOR ART)

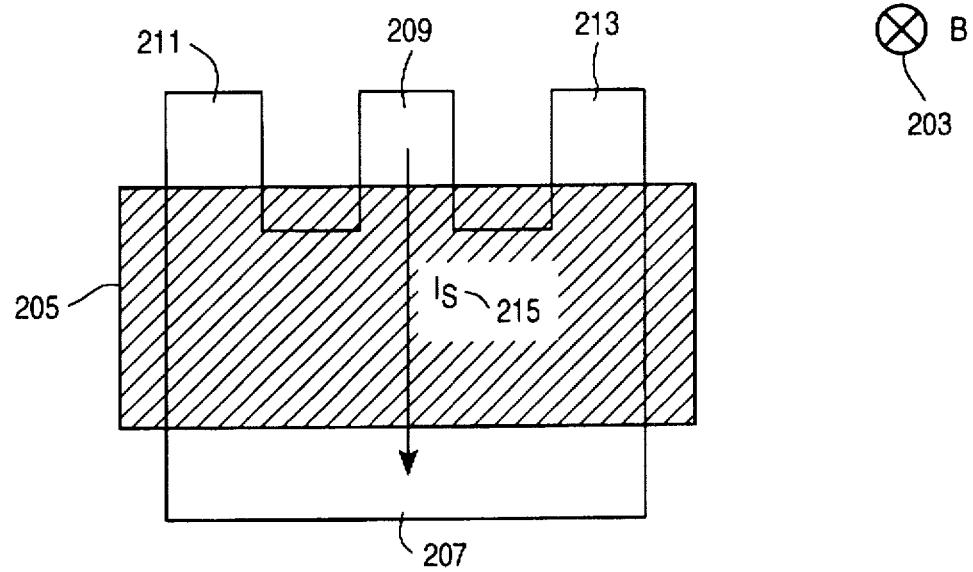
FIG_2 (PRIOR ART)
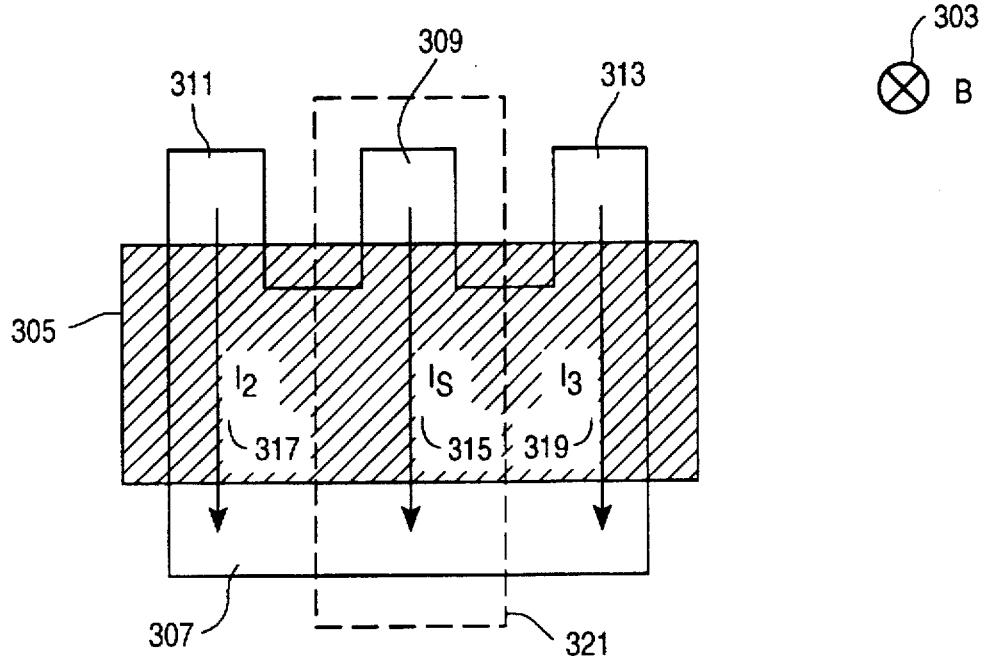
FIG_3

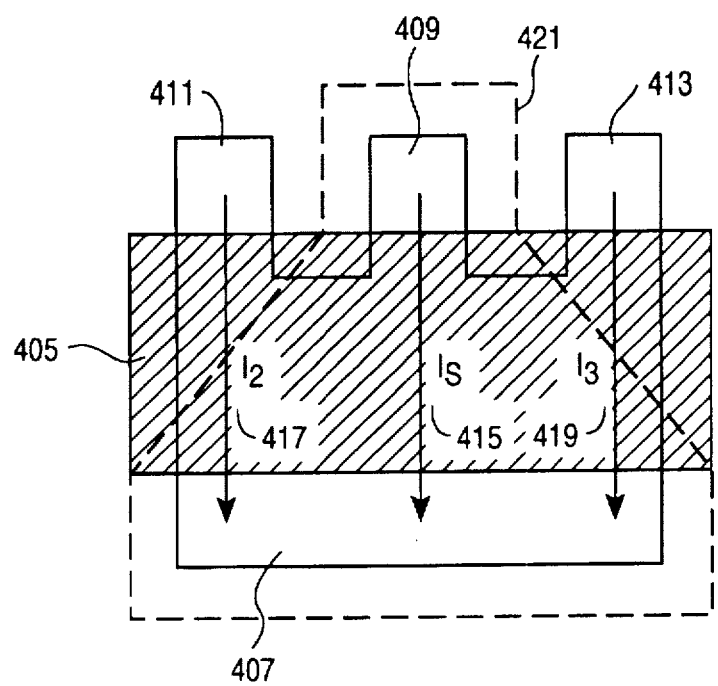
FIG_4
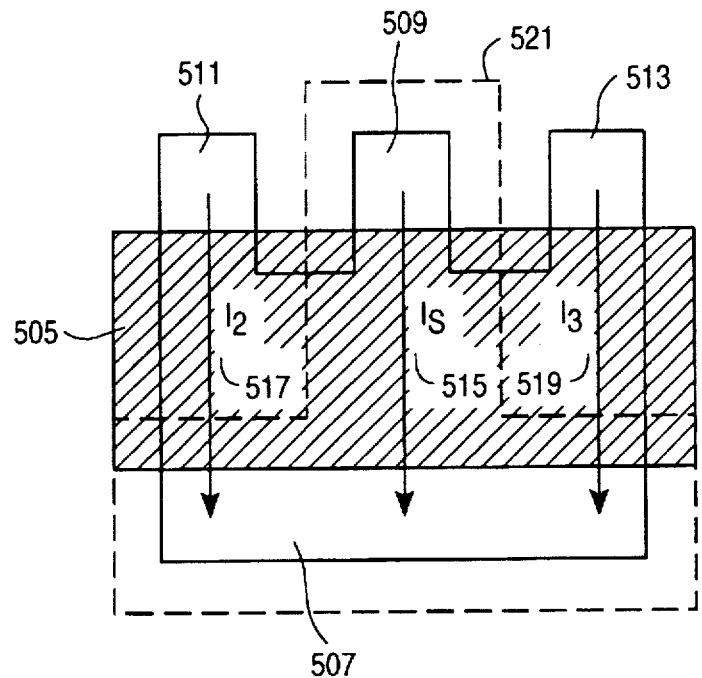
FIG_5

TRIPLE DRAIN MAGNETO FIELD EFFECT TRANSISTOR WITH HIGH CONDUCTIVITY CENTRAL DRAIN

BACKGROUND OF THE INVENTION

Field of the Invention

The present invention relates generally to magnetic field sensors and more specifically, the present invention relates to magnetic field effect transistors.

DESCRIPTION OF THE RELATED ART

Magnetic field sensors are used in a number of industries today. For example, in the medical industry, magnetic field sensors are useful in magnetic imaging technology. In the electronics industry, magnetic field sensors are used in circuits to measure magnetic fields produced by electric currents or the earth's magnetic field.

A wide variety of types of magnetic field sensors may be used to measure the flux of a magnetic field. Hall Effect magnetic field sensors are presently used in many applications in which it is desired to measure a magnetic flux. These magnetic field sensors convert magnetic flux into a signal in the form of a differential voltage which may then be manipulated in accordance with conventional methods of analog circuit design. An important property of magnetic field sensors is this sensitivity of the sensor to magnetic flux.

FIG. 1 is an illustration of a conductive strip 101 exhibiting the properties of the Hall Effect in response to a magnetic field 103. A sense current $I_s$ 105 flows through the conductive strip 101. Conductive strip 101 contains many charge carriers 107 which flow through conductive strip 101 with a velocity shown as V 109. It is noted that in FIG. 1, charge carrier 107 is shown as a "hole" and therefore flows in the same direction as $I_s$ 105. Charge carrier 107 may also be an electron and in such a case would therefore flow in an opposite direction of $I_s$ 105, and V 109 would correspondingly point in the opposite direction. With magnetic field B 103, flowing "into the page" in this example, a Lorentz force is exerted upon moving charged particle 107, shown as F 111 in FIG. 1. The Lorentz force equation is given by the following relationship:

$$F = qV \times B \quad \text{(Equation 1)}$$

Where F is the Lorentz force, q is an electric charge, V is the velocity vector of the moving charge carrier and B is the magnetic field vector. Charge carrier 107 will be deflected from its normal course with an acceleration which is proportional to the charge on the particle, q, the magnetic field, B 103, and the component of the charge carrier's velocity, V 109, which is perpendicular to the magnetic field. This acceleration will be in a direction perpendicular to both the velocity V 109 of the charge carrier and the magnetic field B 103 at that position in space as determined by the right-hand rule.

If such a magnetic field were to exist within a semiconductor in which a current is flowing, this acceleration will result in a deflected current as a result of the Lorentz force. Such a current would result in a continuous increase in local charge density unless it is compensated by an opposing current. This opposing current is developed due to the electric field which such a charge creates. This acceleration due to electric field will, in the static case, precisely balance the local acceleration due to the Lorentz force. This electric field implies a voltage drop:

$$V_H = \int E \cdot dl \quad \text{(Equation 2)}$$

where $V_H$ is a Hall voltage and E is the electric field.

In the case of the conductive strip 101 shown in FIG. 1, the Hall voltage VH may be determined using the following Hall effect relationship:

$$V_H = \frac{I_s B_1}{nq_o h} \quad \text{(Equation 3)}$$

where $I_s$ is the current, B. is the magnetic field, n is the density of charge carriers in the conductive strip, $q_o$ is the value of an electronic charge which is $1.602 \times 10^{-19}$ coulombs, and h is the thickness of the conductive strip. In accordance with Equation 3, it is observed that the Hall voltage $V_H$ is inversely proportional to the charge carrier density n in the conductive strip and directly proportional to the sense current $I_s$.

One type of magnetic field sensor which utilizes the Hall effect to measure magnetic flux is a magnetic field effect transistor (MagFET). MagFETs are transistors that have a gate, source and drain which use the application of a gate voltage to selectively control the carrier concentration in the conductive channel in the silicon region below the gate. By this means, a transistor may be biased to minimize the carrier concentration n below the gate to produce the largest optimal Hall voltage possible in accordance with Equation 3 above.

FIG. 2 shows a triple drain MagFET 201 which is used to measure the flux of a magnetic field B 203. Similar to ordinary field effect transistors, MagFET 201 has a gate 205 and source 207. MagFET 201 also has three drains, center drain 209 and two lateral drains 211 and 213. A sense current $I_s$ 215 is configured to pass through the central drain 209 to the source 207 as determined by the biasing point of the gate 205. This gate voltage simultaneously determines the carrier concentration of the silicon surface. With the presence of magnetic field B 203, a voltage differential develops between the lateral drains 211 and 213 as a result of the Hall effect. The differential voltage between the two lateral drains shown in FIG. 2 is proportional to the component of the magnetic field perpendicular to the "page." One limitation in maximizing the Hall voltage as described in Equation 3 is that the current $I_s$ 215 through the central drain 209 which is to be deflected by the Lorentz force is proportional to the carrier concentration in the conductive channel between the center drain 209 and source 207. That is, by reducing the carrier concentration n in Equation 3, the sense current $I_s$ is correspondingly reduced. Assuming Is equals knh, and substituting such a relationship into Equation 3 for the Hall voltage, the following relationship is obtained:

$$V_H = \frac{knhB_1}{nqh} = \frac{kB_1}{q} \quad \text{(Equation 4)}$$

Consequently, the manipulation of the carrier density in the conductive channel in the silicon beneath the gate of the MagFET by variation of the gate potential is limited since reducing n results in the reduction of $I_s$. As a result, the Hall voltage $V_H$ is effectively independent of $I_s$ and n. Therefore, efforts to maximize the Hall voltage $V_H$ by simply biasing the gate of the MagFET to minimize carrier concentration under the gate are limited.

Thus, what is desired is a magnetic field sensing transistor which measures a magnetic field and maximizes the resulting Hall voltage by biasing the transistor accordingly. Such a transistor would effectively dissociate or decouple the sense current from the background carrier concentration in the lateral drains of a triple drain MagFET and thereby allow an increased sense current with a decreased carrier concentration to maximize the resulting Hall voltage.

SUMMARY OF THE INVENTION

A magnetic field effect transistor for measuring magnetic field is disclosed. In one embodiment, the MagFET has a gate, a source, a center drain and two lateral drains. A high conductivity channel is disposed between the source and center drain of the MagFET. The high conductivity channel has a first doping concentration. Second and third conductive channels are disposed between the source and the two lateral drains respectively. At least a portion of the second and third conductive channels have a second doping concentration. The carrier concentration in the high conductivity channel is greater than the carrier concentration in the portion of the second and third conductive channels respectively. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

FIG. 1 is an illustration of a conductive strip exhibiting the properties of the Hall effect.

FIG. 2 is an illustration of a prior art triple drain MagFET.

FIG. 3 is an illustration of a triple drain MagFET in accordance with the teachings of the present invention.

FIG. 4 is another embodiment of a triple drain MagFET in accordance with the teachings of the present invention.

FIG. 5 is yet another embodiment of a triple drain MagFET in a accordance with the teachings of the present invention.

DETAILED DESCRIPTION

A triple drain magneto field effect transistor (MagFET) for measuring magnetic field is described. In the following detailed description, numerous specific details are set forth in order to provide a thorough understanding of the present invention. It will be apparent, however, to one having ordinary skill in the art that the specific details need not be employed to practice the present invention. In other instances, well known materials or methods have not been described in order to avoid obscuring the present invention.

In the presently described triple drain MagFET, the threshold adjust implant in the region connecting the central drain and the source is selectively modified so as to substantially dissociate or decouple a sense current flowing between the central drain and the source from the background carrier concentration in the lateral drains. By decoupling the sense current from the background carrier concentration, the sense current may be increased by the present invention without having to increase the background carrier concentration in the lateral drains. As a result, MagFET sensitivity is improved significantly thereby maximizing resulting Hall voltages output by the triple drain MagFET in response to the presence of a magnetic field.

FIG. 3 is an illustration of a triple drain MagFET 301 in accordance of the teachings of the present invention. MagFET 301 includes a gate 305 and source 307 with three drains, center drain 309, and two lateral drains 311 and 313. In MagFET 301, sense current $I_s$ 315 flows through a high conductivity channel disposed between center drain 309 and source 307. In one embodiment, the carrier concentration in the high conductivity channel is much higher than the carrier concentration in the regions of the lateral drains 311 and 313. In the embodiment, sense current $I_s$ 315 is significantly higher for a given gate voltage on gate 305 without significantly altering the background carrier concentration in the regions of the lateral drains 311 and 313. Therefore, the embodiment significantly increases in effect the value of k in Equation 4 discussed above and MagFET sensitivity is increased accordingly.

In one embodiment of the present invention, the high conductivity channel for $I_s$ 315 is realized by modifying an ordinary threshold adjust ion implantation step employed in common MOS processes. In particular, the threshold adjust ion implantation step is suppressed in region 321 so as to reduce the threshold voltage of the region between central drain 309 and source 307. As a result, the high conductivity channel is realized. The conductive paths between the two lateral drains 311 and 313 in which currents $I_2$ 317 and $I_3$ 319 flow respectively receive normal threshold ion implantation. Thus, the threshold voltage for the channels in which $I_2$ 317 and $I_3$ 319 flow is higher than the threshold voltage for the high conductivity channel.

With the high conductivity of the present invention, MagFET 301 is capable of carrying significantly more current $I_s$ 315 without raising the background carrier concentration in the lateral drains 311 and 313. The increased current $I_s$ 315 results in an increased lateral Lorentz current, which is injected into a region of lower conductivity in the presence of magnetic field B 303. The lower conductivity of the lateral drain regions results in an increased Hall voltage, in accordance with Equation 3. As described above, the Hall voltage produces an electric field and associated current which opposes the Lorentz current. With the high conductivity channel of the present invention, the Lorentz current deflected from $I_s$ 315 may be separately optimized from the background carrier concentration in the regions of the two lateral drains 311 and 313.

It is noted that the embodiment shown in FIG. 3 utilizes electrons as the charge carriers of the magnetic field sensor. It is appreciated that "holes" may also be used in accordance with the teaching of the present invention. In addition, it is also noted that in some instances the threshold adjust ion implantation or diffusion step could also have been suppressed outside region 321 in order to realize the high conductivity channel. Whether the threshold adjust ion implantation step is suppressed inside or outside region 321 depends upon whether the threshold adjust step raises or lowers the absolute value of threshold voltage of the implanted region.

In one embodiment of the present invention, the lateral drains 311 and 313 of MagFET 301 are optimally biased in very weak conduction when measuring the strength of magnetic field B 303. This biasing configuration provides increased amplification of the Hall voltage generated in response to magnetic field B 303. Amplification or sensitivity increases with $V_{GATE}-V_{TLOW}$ and decreases with $V_{GATE}-V_{THIGH}$. $V_{TLOW}$ represents the threshold voltage of the high conductivity channel disposed between the center drain 309 and source 307. $V_{THIGH}$ represents the threshold voltage of the conductive regions between the two lateral drains 311 and 313 and source 307 respectively. As discussed above, the threshold voltage in the high conductivity region, $V_{TLOW}$, is lower than the threshold voltage in the lateral drain regions, $V_{THIGH}$, as a result of the suppression of the threshold ion implantation step in the high conductivity region. By biasing the region of the two lateral drains 311 and 313 in very weak conduction, the voltage on gate 305, $V_{GATE}$, will be nearly equal to the threshold voltage of the regions of the two lateral drains 311 and 313. Hence, the denominator of Equation 3 will approach zero as n approaches zero which will result in the amplification of the Hall voltage since the sense current, $I_s$, 242 does not decrease proportionally to the carrier concentration, n.

Therefore, by reducing the coupling between the sense current $I_s$ 315 and the background carrier concentration n in the lateral drains 311 and 313, the Hall voltage may be maximized in accordance with Equation 3 above. That is, sense current $I_s$ 315 may be maximized while the background carrier concentration n in the lateral drains may be reduced simultaneously.

FIGS. 4 and 5 show other embodiments in accordance with the teachings of the present invention. MagFET 401 is a triple drain MagFET with high conductivity channel for sense current $I_s$ 415 to flow between the central drain 409 and source 407. The threshold adjust ion implantation is suppressed in region 421. Thus, the high conductivity channel has a lower threshold voltage than the threshold voltage of the regions of the two lateral drains 411 and 413. Similarly, the threshold adjust ion implantation step is suppressed in region 521 of MagFET 501 resulting in the threshold voltage of the high conductivity channel disposed between central drain and source 507 to be lower than the threshold voltage of the regions of the two lateral drains 511 and 513.

In sum, a triple drain MagFET having a high conductivity central drain has been described. The MagFET provides increased Hall voltages in response to magnetic fields by substantially decoupling a sense current flowing through the high conductivity channel disposed between the central drain and source of the disclosed MagFET from the background carrier concentration of the regions of the neighboring two lateral drains of the triple drain MagFET. With the sense current substantially decoupled from the carrier concentration of the lateral drains, the disclosed triple drain MagFET provides increased Hall sensitivity by allowing an increased sense current to flow through the MagFET while simultaneously allowing a reduced background carrier concentration in the lateral drains to generate an increased Hall voltage. The method of the present invention has been described with reference to specific exemplary embodiments thereof. It will, however, be evident that various modifications and changes may be made thereto without departing from the broader spirit and scope of the present invention. The present specification and drawings are accordingly to be regarded as illustrative rather than restrictive.

What is claimed is:

1. A transistor for measuring a magnetic field, the transistor having a gate, a source, a center drain and two lateral drains, the transistor comprising:

a high conductivity channel disposed between the source and the center drain, the high conductivity channel having a first doping concentration; and second and third conductive channels disposed between the source and the two lateral drains respectively, wherein a portion of the second and third conductive channels have a second doping concentration such that a carrier concentration in the high conductivity channel is greater than a carrier concentration in the portion of the second and third conductive channels respectively.

2. The transistor described in claim 1 wherein a sense current is configured to flow through the high conductivity channel, the transistor configured to generate a hall voltage between the two lateral drains in response to the magnetic field.

3. The transistor described in claim 2 wherein the two lateral drains are configured to be biased in weak conduction when measuring the magnetic field.

4. In a transistor for measuring magnetic field, the transistor having a gate, a source, a center drain and two lateral drains, a method for measuring magnetic field comprising the steps of:

disposing a high conductivity channel between the center drain and the source; and reducing a coupling between a sense current configured to flow through the high conductivity channel and a background carrier concentration of the lateral drains of the transistor, the reducing steps including the steps of:

doping the high conductivity channel to a first doping concentration: and doping a portion of second and third conductive channels to a second doping concentration respectively, the second and third conductive channels disposed between the source and the two lateral drains respectively, wherein a carrier concentration in the high conductivity channel is greater than a carrier concentration in the portion of the second and third conductive channels.

5. The method described in claim 4 wherein the steps of doping the high conductivity channel and the portions of the second and third channels respectively includes the step of suppressing a threshold adjust ion implantation in the high conductivity channel.

6. The method described in claim 5 including the additional steps of:

passing the sense current through the high conductivity channel;

biasing the two lateral drains to be in weak conduction; and measuring a voltage difference between the two lateral drains, wherein the voltage difference indicates a strength of the magnetic field.

7. The method described in claim 4 wherein the steps of doping the high conductivity channel and the portions of the second and third channels respectively includes the step of suppressing a threshold adjust ion implantation in the portions of the second and third channels respectively.

8. The method described in claim 7 including the additional steps of:

passing the sense current through the high conductivity channel;

biasing the two lateral drains to be in weak conduction; and measuring a voltage difference between the two lateral drains, wherein the voltage difference indicates a strength of the magnetic field.

* * * * *